United States Patent [19]

Bierlein et al.

[11] Patent Number: 4,766,954
[45] Date of Patent: Aug. 30, 1988

[54] PROCESS FOR PRODUCING AN OPTICAL WAVEGUIDE

[75] Inventors: John D. Bierlein, Wilmington, Del.; Lothar H. Brixner, West Chester, Pa.; August Ferretti; William Yang-Hsing Hsu, both of Wilmington, Del.

[73] Assignee: E. I. Du Pont de Nemours and Company, Wilmington, Del.

[21] Appl. No.: 129,058

[22] Filed: Dec. 11, 1987

Related U.S. Application Data

[63] Continuation-in-part of Ser. No. 1,417, Jan. 8, 1987, Pat. No. 4,740,265.

[51] Int. Cl.$^4$ .......................... B01J 17/24; B05D 5/06
[52] U.S. Cl. ............................ 156/624; 156/DIG. 71; 156/DIG. 75; 156/DIG. 81; 156/607; 350/96.12; 350/96.15; 350/96.30; 350/96.34; 427/164
[58] Field of Search ....... 156/624, DIG. 71, DIG. 75, 156/DIG. 81, 607; 350/96.12, 96.15, 96.3, 96.34; 427/164, 86

[56] References Cited

U.S. PATENT DOCUMENTS

| | | | |
|---|---|---|---|
| 3,811,912 | 5/1974 | Ramaswamy | 350/96.12 |
| 3,949,323 | 4/1976 | Bierlein et al. | 337/7.51 |
| 3,998,687 | 12/1976 | Ballman et al. | 156/619 |
| 4,037,005 | 7/1977 | Phillips | 427/162 |
| 4,073,675 | 2/1978 | Ballman et al. | 156/600 |
| 4,206,251 | 6/1980 | Chen | 427/100 |
| 4,231,838 | 11/1980 | Gier | 156/600 |
| 4,284,663 | 8/1981 | Carruthers et al. | 427/164 |
| 4,305,778 | 12/1981 | Gier | 156/623 R |
| 4,329,016 | 5/1982 | Chen | 350/96.12 |

FOREIGN PATENT DOCUMENTS 0004974 10/1979 European Pat. Off. .... 156/DIG. 75

OTHER PUBLICATIONS

Ishitani et al., "Single-Crystal $Sr_2Nb_2O_7$ Film Optical Waveguide Deposited by Rf Sputtering", Appl. Phy. Lett., 29, 289–291 (1976).
Zumsteg et al., "K $Rb_{1-x}$ $TiOPO_4$: A New Nonlinear Optical Material", J. App. Phys. 47, 4980–4985 (1976).
Belt et al., "KPT as a Harmonic Generator for Nd:YAG Lasers", Laser Focus/Electro-Optics, 110–124 (Oct. 1985).
Massey et al., "Raman and Electrotropic Properties of Potassium Titanium Phosphate", Applied Optics, 24, 4136–4137 (1980).

*Primary Examiner*—Asok Pal

[57] ABSTRACT

There is disclosed a process for producing an optical waveguide comprising contacting at least one optically smooth surface of a single crystal of $K_{1-x}Rb_xTiOMO_4$ wherein x is from 0 to 1 and M is P or As with a specified molten salt of at least one of Rb, Cs and Tl at a temperature of from about 200° C. to about 600° C. for a time sufficient to increase the surface index of refraction at least about 0.00025 with respect to the index of refraction of the starting crystal, and cooling the resulting crystal. The product made thereby and a waveguide device using the same are also disclosed.

14 Claims, No Drawings

PROCESS FOR PRODUCING AN OPTICAL WAVEGUIDE

CROSS-REFERENCE TO RELATED APPLICATION

This is a continuation-in-part application of copending application Ser. No. 001,417 filed Jan. 8, 1987, now U.S. Pat. No. 4,740,265.

BACKGROUND OF THE INVENTION

1. Field of the Invention

This invention relates to optical waveguides and a process for making them.

2. Description of Related Art

Much work has been directed toward developing optical communications systems. The basic element of such systems is the optical waveguide which transmits or guides optical waves from one point to another and serves to connect various devices in an optical integrated circuit. Such waveguides consist of an optically transparent waveguiding medium surrounded by media with lower indices of refraction so that light propagating along the waveguide is totally reflected at the boundaries with the surrounding media. In optical integrated circuits, the two basic waveguide geometries are the planar or slab waveguide and the channel or strip waveguide.

U.S. Pat. No. 3,998,687, issued to Ballman, et al., on Dec. 21, 1976, discloses a technique for growing an epitaxial thin film of lithium niobate involving immersing a lithium tantalate substrate seed crystal into a supercooled melt of a flux system selected from among $Li_2B_2O_4$—$Li_2Nb_2O_6$, $Li_2WO_4$—$Li_2Nb_2O_6$, $K_2WO_4$—$Li_2Nb_2O_6$, and $WO_3$—$Li_2Nb_2O_6$, and after establishing equilibrium, withdrawing the seed from the flux and cooling the withdrawn seed. The films are disclosed to be useful as optical waveguides.

U.S. Pat. No. 4,073,675, issued to Ballman, et al., on Feb. 14, 1978, discloses a process for producing epitaxial crystalline films of $LiNbO_3$ on $LiTaO_3$ substrates on a selected crystallographic plane comprising applying a powder of $LiNbO_3$ on the $LiTaO_3$ substrate, heating to a temperature above the melting temperature of $LiNbO_3$ but below the melting temperature of $LiTaO_3$, and then cooling slowly, i.e., between 10° and 50° C. per hour to below the melting point of $LiNbO_3$.

U.S. Pat. No. 4,037,005, issued to Phillips on July 19, 1977, discloses a method for making optical waveguides wherein a niobium or niobium-oxide coated single crystal of lithium tantalate is heated to allow niobium to diffuse into the crystal and then the crystal is cooled. When the crystal is coated with niobium, the niobium is oxidized during the lower temperature range in the heating step. Diffusion occurs at about 1050° to 1250° C.

U.S. Pat. No. 4,284,663, issued to Carruthers, et al., on Aug. 18, 1981, discloses a method of fabricating an optical waveguiding surface layer in an optically transparent crystalline substrate, such as lithium niobate, by depositing a layer of a metal selected from transition element metals having an atomic number of 21 to 30, as well as silver and gold, onto a surface of the substrate and heating the resultant product at about 800° C. to 1100° C. to indiffuse the metal.

U.S. Pat. No. 4,206,251, issued to Chen on June 3, 1980, and U.S. Pat. No. 4,329,016, issued to Chen on May 11, 1982, disclose a process for diffusing a metal into a substrate which may be either a semiconductor material or a dielectric material comprising coating the substrate with a liquid composition comprising organometallic solutions of the desired metal and silica, heating the resulting coated substrate at an elevated temperature for a period of time sufficient to cause the organic portion of the solution to decompose, thereby leaving a composite film comprising an oxide of the desired metal and silica, heating the resulting structure further to cause diffusion of the metal from the metal oxide into the substrate. $LiNbO_3$ is specifically mentioned as a substrate and diffusion of Ti is specifically discussed. The patents also disclose the optical waveguide device formed by the process. The composite film formed in the process prevents $Li_2O$ out-diffusion.

Ishitani, et al, *Appl. Phys. Lett* 29, 289–291 (1976), disclose an optical waveguide comprising a single-crystal $Sr_2Nb_2O_7$ film grown onto a b-plate $Sr_2Ta_2O_7$ single-crystal substrate by rf sputtering.

U.S. Pat. No. 3,949,323, issued to Bierlein, et al., on Apr. 6, 1976, discloses nonlinear optical devices and electro-optic modulators which use a crystal consisting of a compound having the formula $MTiO(XO_4)$, wherein M is at least one of K, Rb, Tl or $NH_4$ and X is at least one of P or As and wherein X is P when M is $NH_4$.

Zumsteg, et al., *Journal of Applied Physics* 47, 4980–4985 (1976), disclose that $K_xRb_{1-x}TiOPO_4$ is a nonlinear optical (NLO) material with large NLO coefficients, transparent over a large range of wavelengths, not readily susceptible to laser damage, and chemically inert.

U.S. Pat. No. 4,231,838, issued to Gier on Nov. 4, 1980, discloses a process for the manufacture of single crystals of $MTiOXO_4$, wherein M is K, Rb or Tl and X is P or As, of optical quality and of sufficient size for use in nonlinear optical devices, said process comprising heating starting ingredients, chosen to be within the region of the ternary phase diagram in which the desired crystal $MTiOXO_4$ product is the only stable solid phase, to produce $MTiOXO_4$, and then controllably cooling to crystallize the desired product. Crystals which have mixtures of elements for M and/or X can be grown by the process.

U.S. Pat. No. 4,305,778, issued to Gier on Dec. 15, 1981, discloses a hydrothermal process for growing single crystals of $MTiOXO_4$, wherein M is K or Rb and X is P or As, said process involving using as a mineralizing solution an aqueous solution of a glass defined by specified portions of the ternary diagrams for the selected $M_2O/X_2O_5/(TiO_2)_2$ system.

Publications discussing the nonlinear or electro-optic properties of $KTiOPO_4$ (KTP) include Belt, et al., *Laser Focus/Electro-optics*, 110–124 (October 1985), and Massey, et al., *Applied Optics* 24, 4136–4137 (1980).

SUMMARY OF THE INVENTION

The present invention provides a process for producing an optical waveguide comprising contacting at least one optically smooth surface of a single crystal of $K_{1-x}Rb_xTiOMO_4$ wherein x is from 0 to 1 and M is P or As with a molten salt or molten mixture of salts of at least one salt of Rb, Cs and Tl at a temperature of from about 200° C. to about 600° C. for a time sufficient to increase the surface index of refraction at least about 0.00025 with respect to the index of refraction of the starting crystal, and cooling the resulting crystal; with the provisos that (a) when x is from zero to 0.8, said molten salt is at least one selected from the group consisting of RbNO$_3$, CsNO$_3$, TlNO$_3$, and said molten mixture is at least one of RbNO$_3$, CsNO$_3$ and TlNO$_3$ with at least one nitrate selected from the group of Ca(NO$_3$)$_2$, Sr(NO$_3$)$_2$ and Ba(NO$_3$)$_2$ or of RbCl with at least one chloride selected from the group of ZnCl$_2$ and LiCl; ; and (b) when x is at least 0.8, the molten salt is CsNO$_3$ and/or TlNO$_3$ and the molten mixture is at least one of CsNO$_3$ and TlNO$_3$ with at least one nitrate selected from the group of Ca(NO$_3$)$_2$, Sr(NO$_3$)$_2$, and Ba(NO$_3$)$_2$.

It is preferred that the RbNO$_3$, CsNO$_3$, TlNO$_3$ molten salts or mixtures thereof contain dissolved therewith at least one of the alkaline earth metal nitrates Ca(NO$_3$)$_2$, Sr(NO$_3$)$_2$ and Ba(NO$_3$)$_2$, e.g. the RbNO$_3$—Ca(NO$_3$)$_2$ eutectic solution; and when a molten mixture of RbCl and at least one chloride is used, then it is preferred that the molten mixture be the RbCl—ZnCl$_2$ solution.

DETAILED DESCRIPTION OF THE INVENTION

For slab or channel waveguides, it is necessary that the material through which the light is propagated have an index of refraction larger than that of surrounding media. However, in order that the light is propagated along and is confined to the slab or channel material there are more stringent requirements. Generally, modes of propagation are classified into two kinds according to the orientation of the field vectors: those with transverse electric fields (TE modes) and those with transverse magnetic fields (TM modes). The solutions to Maxwell,s equations for these modes for a slab waveguide are well-known (see, e.g., "Optical Waves in Crystals", Yariv, et al., John Wiley & Sons, New York, Chapter 11 (1984); or "Integrated Optics: Theory and Technology", Hunsperger, Springer-Verlag, Berlin, 16-37 (1982). The number of such confined modes depends on the frequency of the light wave, the depth of the slab, and the indices of refraction of the three media involved, i.e., that of the substrate or plate material, $n_s$, that of the slab waveguide material, $n_s + \Delta n$, and that of the material above the top surface of the slab waveguide, $n_a$. For a given frequency, the number of confined modes increases with increasing slab depth or with increasing index of refraction of the slab, i.e., with increasing $\Delta n$. For an extremely thin slab or an extremely small $\Delta n$, no mode is confined. As the depth of the slab and/or $\Delta n$ is increased, one mode becomes confined, then another, etc.

The solutions of Maxwell's equations for confined modes for a channel waveguide are more complicated than for a slab waveguide. For this reason, only approximate solutions have been obtained (see "Integrated Optics: Theory and Technology", Hunsperger, Springer-Verlag, Berlin, 38-43 (1982)). For a given value of $\Delta n$, there are certain minimum values for the depth and width of the of the channel in order for the channel to be able to confine a mode. These depth and width values are not independent, i.e., to confine a given mode, wider channels can be less deep while narrower channels require a greater depth. Typically, the depths and widths, of approximately square channel waveguides are several times the depth of a slab waveguide. For both slab and channel waveguides, the index of refraction must be large enough so that at least one mode is confined.

In the process of the invention, a single crystal of K$_{1-x}$Rb$_x$TiOMO$_4$, wherein x is from 0 to 1 and M is P or As, having at least one optically smooth surface is contacted with a molten salt of at least one of Rb, Cs and Tl. Preferably, x is 0 and M is phosphorous. Single crystals for use in the present process can be prepared by the processes disclosed in U.S. Pat. Nos. 3,949,323, 4,231,838 and 4,305,778.

As stated previously, Rb, Cs and Tl salts suitable for use in the present process are preferably selected from the nitrates of Rb, Cs and Tl. Also suitable are solutions of Ca(NO$_3$)$_2$, Sr(NO$_3$)$_2$ or Ba(NO$_3$)$_2$ with the nitrates of Rb, Cs or Tl, e.g. the Rb(NO$_3$)—Ca(NO$_3$)$_2$, eutectic, and Zn(Cl)$_2$ or LiCl with RbCl, e.g. the RbCl—LiCl eutectic. Mixtures containing divalent cations are preferred.

When x is other than zero, Rb$^+$ ions can serve as a replacement ion for K$^+$ ions, if the number of replacement Rb$^+$ ions is sufficient to result in an increase in the surface refractive index of at least about 0.00025 with respect to the refractive index of the starting crystal. For practical reasons, when x is about 0.80 or more, the replacement ions are Cs$^+$ or Tl$^+$.

The molten salt solutions that may be used in the process of the invention are chosen in part to take advantage of the significantly lower melt temperatures possible as the composition of the molten salt moves from just Rb, Cs and Tl salts and approaches a eutectic composition with other salts. It is not necessary to operate at the exact eutectic composition or temperature and, in fact, doing so may make the process too sensitive to slight operational changes. It is advantageous to use the molten salt at a temperature somewhat above the melting temperature of the composition in order to avoid freezing of the melt by a cooler substrate or a slight variation in temperature.

The use of a solution containing divalent ions, e. g., Ca$^{++}$, Sr$^{++}$, Ba$^{++}$ or Zn$^{++}$, with the Rb$^+$, Cs$^+$ and/or Tl$^+$ ions provides the additional advantage of a wide degree of control of waveguide refractive index and thickness and greatly decreases the dependence of the waveguide characteristics on the single crystal substrate's ionic properties. Thicker waveguides can be prepared with such solutions and waveguides with essentially the same characteristics as those made with just Rb, Cs and Tl salts can be made at lower molten salt temperaures and/or in shorter times.

The divalent ions, as well as Rb$^+$, Cs$^+$ and/or Tl$^+$ ions, exchange with the monovalent cations, i.e., the K$^+$ ions of a KTiOPO$_4$ substrate. A cation vacancy is created for each divalent ion exchanged. These vacancies can move by exchanging with a neighboring lattice K$^+$ ion. This increases the K$^+$ conduction and the conduction of the Rb$^+$, Cs$^+$ and/or Tl$^+$ ion into the lattice. The effect appears to be especially pronounced for Ba$^{++}$ ion and the addition of even small amounts of a barium salt has a significant effect. It is believed that Ba$^{++}$ ion is especially effective because the size of the Ba$^{++}$ ion is nearly the same as that of the K$^+$ ion and it may, therefore, be more readily incorporated into the lattice than the Ca$^{++}$ and Sr$^{++}$ ions.

Useful as molten salts in the process of the invention are compositons ranging from just Rb, Cs and Tl nitrates to solutions of one or more of these nitrates with at least one of the alkaline earth metal nitrates, e.g. Ca—, Sr— and Ba—nitrate, where the content of the alkaline earth metal nitrate equals and even exceeds that of the eutectic composition. The melting temperatures of the solutions increase rather rapidly as the content of the alkaline earth metal nitrate exceeds that of the eutectic composition and as a result the process becomes more sensitive to slight operational changes for such compositions. Preferred are the solutions which contain at least about 35 mol % of the Rb, Cs and/or Tl nitrate.

Solutions of RbCl with appropriate other chlorides are quite desirable. For example, a solution of RbCl—LiCl with the composition being close to the eutectic composition, i.e. about 45 mol % RbCl and 55 mol % LiCl, has a sufficiently low melting temperature to be among the preferred. The melting point rises rather rapidly as the composition deviates from the eutectic composition so that solutions within a range of compositions close to the eutectic composition are preferred, i. e., solutions containing from about 35 mol % to about 55 mol % RbCl. Another solution involving RbCl which operates quite well is RbCl—$ZnCl_2$. This solution provides the additional advantage of having a divalent $Zn^{++}$ ion present in the solution. Preferred again are solutions with $ZnCl_2$ containing from about 35 mol % to about 55 mol % RbCl.

The molten solutions should be prepared by carefully weighing out the component salts and intimately mixing them either mechanically or as aqueous solutions. The mixed aqueous solutions are then spray-dried to avoid possible segregation of the components upon evaporation of the water.

Phase diagrams for the various solutions that can be used as the molten salt in the process of the invention can be found in "Phase Diagrams for Ceramist", edited by Levin, Robben and McMurdle, Am. Ceramic Soc., 1964. These diagrams are useful for choosing the composition of the solution and the contact temperature.

At least one optically smooth surface of the single crystal is contacted with the molten salt at a temperature of from about 200° C. to about 600° C. for a time sufficient to increase the surface index of refraction at least about 0.00025 with respect to the index of refraction of the starting single crystal. As used herein the expression "optically smooth surface" means a surface which is smooth over a distance that is small compared to the wavelength of the optical wave to be propagated, i.e., sufficiently smooth to result in substantially no scattering of light and with no sub-surface damage that would result in scattering of the guided mode. An optically smooth surface can be provided by a natural face of the crystal as obtained by cleaving a crystal, by flux growth, or by well-known mechanical or chemical polishing techniques.

Preferably, the temperature during contacting is from about 325° C. to about 450° C. when x is 0 and the molten salt is Rb, Cs or Tl nitrate or a mixture thereof. When the molten salt is a solution of one or more of Rb, Cs and Tl nitrates with at least one of the alkaline earth metal nitrates, Ca—, Sr— and Ba—nitrate, or is a RbCl—$ZnCl_2$ solution, then the preferred temperature is from about 300° C. to about 450° C. when x is 0. In either case, by operating above 450° C., some etching of the crystal surface may occur. Hence, it is preferred to conduct the contacting below this temperature to avoid surface defects resulting from etching, which defects could cause scattering and attenuation of the optical wave.

The contacting of the optically smooth surface with a molten salt can be conducted in various ways. For example, the salt in the form of a powder can be sprinkled onto the optically smooth surface of the crystal, and then the crystal heated to a temperature within the above-prescribed temperature range and which is above the melting point of the salt. Alternatively, the crystal can be placed in a crucible, preferably made of platinum, gold or silica, and covered with the salt in a powder form. The crucible is then heated in a furnace with adequate temperature control, e.g., a belt furnace, to a temperature as prescribed above. Special precautions should be taken when handling thallium salts. In another embodiment, which is preferred, the salt is placed in a crucible of platinum, gold or heat-resistant inert material such as Pyrex TM and brought to the temperature at which it is to be contacted with the optically smooth surface. If the contact temperature is in the range of about 25° C. to about 50° C. above the melt temperature, the temperature can be raised higher, e.g. up to 100° C. above the contact temperature, for about 2 to 16 hours to aid the melting process; and, when the salt is comprised of a mixture, to aid the solution process. The temperature of the melt is then lowered to the desired contact temperature and allowed to stabilize for about 2 to 16 hours.

The optically smooth crystal is placed in a platinum or gold basket, and then the basket is slowly lowered until the crystal is immersed in the molten salt. The molten salt can be stirred or agitated or the basket can be rotated within the melt to insure that no local variation occurs in the molten material adjacent to the surface of the single crystal substrate. Such stirring may be especially advantageous when scaling up to larger substrates and/or molten baths. After the crystal remains in contact with the molten salt for a sufficient time, the basket is withdrawn to a position just above the surface of the melt to allow the molten salt to drain from the basket. Then the basket is slowly removed from the furnace and allowed to cool to ambient temperature, i.e. about 22° C.

The surface of the single crystal is contacted with the molten salt at the above-prescribed temperature for a time sufficient to increase the surface index of refraction at least about 0.00025, preferably at least about 0.001, with respect to the index of refraction of the starting single crystal. As used herein, the waveguide thickness, d, and the increase in the surface index of refraction, $\Delta n$, are the corresponding effective parameters as determined by the method of Tien, et al., *Applied Physics Letters* 14, 291–294 (1969), unless stated otherwise. In general, the contact time at about 350° C. will be from about 15 minutes to about 6 hours. The contact time allows the Rb, Cs or Tl ions to diffuse into surface of the single crystal and replace the potassium ions there. The specific diffusion temperature and diffusion time needed to form an optical waveguide depends on the ionic conductivity of the crystal when one or more of the Rb, Cs or Tl nitrates is used as the molten salt.

A parameter which is a measure of the ionic conductivity is the dielectric loss angle $\delta$, defined as tan $\delta = \epsilon''/\epsilon'$, where $\epsilon = \epsilon' - i\epsilon''$ is the complex dielectric constant. An increase in tan $\delta$ correlates with an increase in the ionic conductivity. For a typical KTiOPO$_4$ substrate single crystal with tan $\delta = 2.0$ measured at 10 kHz and using RbNO$_3$ as the molten salt, at a heating temperature of 350° C. the major portion of the exchange occurs in the first 15 minutes of contact with the molten nitrate. The effective waveguide thickness and the effective increase in the surface index of refraction are nearly independent of heating temperature as the temperature is increased from 350° C. to 450° C. In addition, annealing a Rb-exchanged waveguide of the invention in air at 300° C. to 350° C. for 0.5 to 2 hours results in no significant change in d or Δn. For substrate crystals with lower tan δ, higher temperatures and/or longer diffusion times are required to form waveguides with similar thicknesses and increases in surface index of refraction.

As indicated previously, the dependence of waveguide characteristics on substrate ionic conduction properties is almost completely eliminated when solutions containing divalent ions are used as the molten salt. Since the ion exchange is a diffusion process, the contact time required to produce a waveguide depends on the contact temperature. For a specific substrate and a specific molten salt, the contact time necessary to produce a waveguide with specific characteristics decreases as the contact temperature increases. These observations indicate that the waveguides made by the process of the invention can be produced in relatively short times and at relatively low temperatures and that the effective parameters of the waveguides made thereby are thermally stable. Heating a waveguide of the invention above the diffusion temperature, e.g. above 400° C. for a Rb-exchanged $KTiOPO_4$ waveguide, can alter the concentration profile of the replacement ion and the refractive index profile with distance into the surface layer. For example, when a Rb-exchanged $KTiOPO_4$ waveguide of the invention is heated above about 400° C. for at least 0.5 hour, the concentration profile of the $Rb^+$ ions, d and Δn change but the waveguide still meets the requirements of the invention.

After the crystal is contacted with the molten salt as prescribed herein, it is cooled to ambient temperature, i.e., about 22° C., and preferably then washed in water to remove excess salt from the surfaces of the crystal.

When channel waveguides are to be formed, suitable masking must be used so that only the unmasked portions of the surface are contacted with the molten salt. Such masking procedures are well-known in the art. For example, a conventional method consists of applying a resist such as a photoresist which polymerizes when irradiated by light. The photoresist is applied to the optically smooth surface of the single crystal and irradiated with a pattern of light to polymerize the resist in those regions where the channel waveguide is to be formed. The unpolymerized portions of the resist are washed away. A metal film of Au, Ag, Al or Ti which is typically 500 to 5000 Å (50 to 500 nm) in thickness is deposited onto the crystal surface and the polymerized resist. The polymerized portion of the resist and the metal covering it are then removed, thereby exposing those portions of the crystal surface which will be contacted with the molten salt to form the desired channels. The remaining metal serves as a mask to cover the rest of the crystal surface to prevent ion diffusion in those portions of the surface.

After the substrate has been cooled following the contact with the molten salt, the metal mask can be removed. Careful polishing can be used to remove the mask. An aluminum mask can be removed by using a 0.2M KOH aqueous solution at ambient temperature. A titanium mask can be removed using a solution comprised of 4 vol. % HF, 4 vol. % $H_2O_2$ and 92 vol. % $H_2O$ at ambient temperature. Generally about 1 to 10 minutes of contact with the solution is required to completely remove the mask. After removal of the metal mask, the substrate is rinsed with distilled water and air dried at ambient temperature.

In a preferred embodiment of the process of the invention, the surface of the crystal which is contacted with the molten salt is a z-surface, i.e., a surface perpendicular to the c- or z-axis. The ion diffusion of the Rb, Cs and/or Tl ions into the crystal surface is highly anisotropic with diffusion along the z-axis being much greater. Therefore, it is important in producing rectangular channel waveguides by the process of the invention that a z-surface be contacted with the molten salt in order to minimize any lateral diffusion of Rb, Cs and Tl ions out of the channel region. The channel waveguides prepared on z-surfaces by the process of the invention are optically uniform over the width of the channel and display no apparent evidence of lateral ion diffusion. Other surfaces can be used to produce channel waveguides with other shapes.

Another aspect of the invention is the channel or slab waveguide made by the foregoing described process of the invention. The waveguide of the invention is a $K_{1-x}Rb_xTiOMO_4$ single crystal, wherein x is from 0 to 1 and M is P or As, having at least one optically smooth surface in which sufficient cations ions have been replaced by ions selected from at least one of $Rb^+$, $Cs^+$ and $Tl^+$ ions to result in an increase in the surface refractive index of at least about 0.00025, preferably at least about 0.001, with respect to the refractive index of the starting crystal. When x is at least about 0.8, the replacement ions are selected from at least one of $Cs^+$ and $Tl^+$ ions. The depth of the surface layer is at least about 0.25 μm. Sufficient cations in the surface layer are replaced with rubidium, cesium and/or thallium to result in the above-stated increase in the surface index of refraction and the necessary depth of the surface layer.

Electron microprobe measurements on waveguides produced by the process of the invention show that when the molten salt is Rb, Cs or Tl nitrate, the concentration, C, of rubidium, cesium and thallium is a maximum at the surface of the crystal and decreases to zero with increasing distance into the surface layer substantially according to the complementary error function, $$C(x) = C\,\text{erfc}(x/d)$$

where ation of Rb, Cs and/or Tl as a function of distance, x, from the surface, $C_o$ is the concentration of Rb, Cs and/or Tl at the surface and d is the characteristic depth. The refractive index profile with distance into the surface layer is believed to follow the Rb, Cs and/or Tl concentration and be a maximum at the surface and decrease according to the complementary error function as the refractive index approaches the value for $KTiOPO_4$ or $KTiOAsO_4$.

The slab or channel optical waveguides produced by the process of the invention are useful in various optical devices, such as modulators and switches as discussed by Hunsberger, "Integrated Optics: Theory and Technology", Springer-Verlag, Berlin, 107–157 (1982).

The optical waveguide device of the invention comprises at least one channel waveguide, means to couple an incoming optical wave into a channel waveguide and means to couple an outgoing optical wave out of a channel waveguide. The channel waveguide is a single crystal according to the invention. The crystal can have more than one channel waveguide. Light can be coupled into and out of the device by attaching an aligned fiber and into and out of a waveguide by abutting an aligned fiber to an end of the waveguide.

The invention is further illustrated by the following examples in which all percentages and parts are by weight and temperatures are in degrees Celsius unless otherwise stated. Unless stated otherwise, the waveguide thickness, d, and the increase in the index of refraction, $\Delta n$, given in the examples were determined by the method of Tien et al. referred to earlier herein by examining the samples for waveguiding by the m-line prism-layer coupler technique described in that article using a 45°–45°–90° rutile prism and an He-Ne laser. Waveguide thickness was determined optically for some examples by using a phase contrast microscope, a Zeiss Axiomat TM. Waveguide thicknesses measured optically correlate with those determined by the m-line prism-layer coupler technique.

EXAMPLE 1

A slab waveguide was prepared by sprinkling $RbNO_3$ powder onto the polished x-surface (surface perpendicular to the x-axis) of a $KTiOPO_4$ crystal to a depth of about 0.5 mm and heating the crystal to about 330° for 2 hours. The resulting crystal was cooled to room temperature, and then was washed with water to remove excess $RbNO_3$.

The resulting waveguide was then examined by the m-line prism-layer coupler technique and 2 TM waveguide modes were observed. The results are summarized in Table 1.

EXAMPLE 2

A slab waveguide was prepared by placing a $KTiOPO_4$ crystal with a polished x-surface in a platinum crucible, covering the crystal with $RbNO_3$ powder, heating the crucible to 450° for 20 minutes, cooling the crucible to ambient temperature, and washing the resulting crystal with water to remove excess $RbNO_3$.

The resulting waveguide was then examined by the m-line prism-layer coupler technique. One TM waveguide mode was observed. The thickness d of the waveguide was estimated to be 1.3 $\mu$m and the increase in the index of refraction, $\Delta n$, of the waveguiding material to be 0.02. The results are summarized in Table 1.

EXAMPLE 3

A slab waveguide was prepared in the following manner. The two z-surfaces of a $KTiOPO_4$ single crystal about 5 mm×5 mm×1 mm thick, were polished with the negative z-surface, z(−), corresponding to a positive pyroelectric constant and the positive z-surface, z(+), corresponding to a negative pyroelectric constant. A loop of Pt wire was placed around the crystal to prevent possible floatation, and the crystal placed on the bottom of a 20 mL platinum crucible. The crystal was then covered with about 8 grams of $RbNO_3$ powder. The crucible was then placed on the belt of a BTU belt furnace which had an overall length of 193 cm (72 inches) with a 61 cm (24 inch) hot zone. The crucible was moved into the hot zone at a rate of 1.3 cm per minute (½ inch per minute), held at a temperature of 350° for 4 hours, and moved out of the hot zone at a rate of 0.64 cm per minute (¼ inch per minute). Heating was carried out in a nitrogen atmosphere. The crystal was allowed to cool to room temperature and then washed in water to remove $RbNO_3$.

The resulting waveguide was then examined by the m-line prism-layer coupler technique. Three TE modes and 3 TM modes were observed for the slab waveguide on the z(+) surface and from these measurements d was estimated to be 4.0 $\mu$m and $\Delta n$ to be 0.019 from the TE measurements and 0.018 from the TM measurements. Three TE modes and 2 TM modes were observed for the slab waveguide on the z(−) surface and from these measurements d was estimated to be 6.5 $\mu$m and $\Delta n$ to be 0.018 from both the TE and the TM measurements. These results are summarized in Table 1.

EXAMPLES 4 AND 5

The waveguides were prepared using procedures substantially similar to that used in Example 3. The crystal surface used, the molten material, the temperature of the molten material, the time of contact of the molten material with the crystal surface, the number of modes observed, and the effective thickness and the effective increase in the index of refraction of the waveguiding material are given in Table 1.

EXAMPLE 6

A waveguide was prepared using a procedure substantially similar to that used in Example 3 except for the heating step and the molten material. The platinum crucible containing the crystal with a polished z-surface was covered with about 8 grams of $TlNO_3$. For safety reasons, the crucible was heated in a programmable tube furnace with flowing nitrogen. The crucible was heated to 335° in 1 hour, held at 335° for 4 hours and cooled to ambient temperature over a 1-hour period. The resulting crystal was then washed in water and examined by the m-line, prism-layer coupler technique. The results are summarized in Table 1.

EXAMPLE 7

A slab waveguide was prepared according to the following procedure. About 35 grams of $RbNO_3$ were melted in a 25 mL gold crucible and held at a temperature of 350°. A $KTiOPO_4$ crystal with a polished z-surface was placed in a platinum basket and slowly lowered into the molten $RbNO_3$. The crystal was held immersed in the molten $RbNO_3$ for about 1 hour, and the basket was withdrawn to a position above the surface of the molten $RbNO_3$ to allow the molten salt to drain from the basket. The basket was slowly removed from the furnace and allowed to cool to ambient temperature. The crystal was then washed in distilled water to remove remaining traces of $RbNO_3$.

The resulting waveguide was then examined by the m-line prism-layer coupler technique. The results are summarized in Table 1.

EXAMPLE 8

A channel waveguide was prepared using a procedure substantially similar to that used in Example 7 except that a metal mask was formed on the crystal surface before it was immersed in the $RbNO_3$ as described below.

A polyester, adhesive, masking tape strip about 1 mm wide was applied to the polished z-surface of the crystal. A layer of gold approximately 500 Å (50 nm) was then sputtered onto the z-surface to form a mask. The tape was removed to expose the crystal surface beneath it. The crystal with the gold mask was then placed in a platinum basket and immersed in molten $RbNO_3$ at 350° C. for about 1 hour. After the cooled crystal was taken from the basket, the metal mask was removed using water and a polishing cloth.

The surface was then examined by the m-line prism-layer coupler technique. No waveguiding was found in the region of the surface which had been under the golden mask and had not come into contact with the molten $RbNO_3$. However, both TE and TM modes were observed for the region of the surface which was not under the mask and which had come into direct contact with the molten $RbNO_3$. The results are summarized in Table 1.

The substrate was allowed to cool to room temperature and then immersed in water at room temperature to wash off the residual nitrates.

Spectroscopic analysis was used to determine the composition of the molten salt that was actually contacted with the substrate. This analysis indicated that the composition was 77.3 mol % $RbNO_3$ and 22.6 mol % $Ba(NO_3)_2$. To avoid possible deviation from the desired composition, all subsequent Examples were

TABLE 1

| Ex. | Molten Mat'l | Temp (°C.) | Contact Time (hours) | Crystal Surface Used | Type Modes Obsd. | No. Modes Obsd. | d (μm) | Δn |
|---|---|---|---|---|---|---|---|---|
| 1 | $RbNO_3$ | 330 | 2.0 | x | TE | 0 | | |
| | | | | | TM | 2 | — | >0.001 |
| 2 | $RbNO_3$ | 450 | 3.3 | x | TE | 0 | | |
| | | | | | TM | 1 | 1.3 | 0.02 |
| 3 | $RbNO_3$ | 350 | 4.0 | z(+) | TE | 3 | 4.0 | 0.019 |
| | | | | | TM | 3 | 4.0 | 0.018 |
| | | | | z(−) | TE | 3 | 6.5 | 0.008 |
| | | | | | TM | 2 | 6.5 | 0.008 |
| 4 | $RbNO_3$ | 350 | 4.0 | z(−) | TE | 2 | 5.6 | 0.009 |
| | | | | | TM | 2 | 5.6 | 0.009 |
| 5 | $CsNO_3$ | 450 | 4.0 | z | TE | 11 | 13 | 0.028 |
| | | | | | TM | 8 | 13 | 0.019 |
| 6 | $TlNO_3$ | 335 | 4.0 | z | TE | 4 | 1.6 | 0.23 |
| | | | | | TM | 4 | 1.6 | 0.18 |
| 7 | $RbNO_3$ | 350 | 1.0 | z | TE | 2 | 7.9 | 0.0027 |
| | | | | | TM | 2 | 7.0 | 0.0020 |
| 8 | $RbNO_3$ | 350 | 1.0 | z | TE | 2 | 9.1 | 0.00185 |
| | | | | | TM | 2 | 9.1 | 0.00135 |

EXAMPLE 9

A channel waveguide was prepared on a $KTiOPO_4$ single crystal about 10 mm × 10 mm × 1 mm thick using the following procedure. An aluminum mask was formed on one of the polished z-surfaces by pulling a graphite fiber taunt over a z-surface of the crystal substrate and holding it with tape at each end. Aluminum is then evaporated onto the surface to form a 600 Å (60 nm) thick film. The graphite fiber is then removed to expose the crystal surface beneath it. The exposed surface is about 6 μm wide and runs the length of the crystal.

The phase diagram for $RbNO_3$—$Ba(NO_3)_2$ prepared by V. E. Plyushchev et al., Doklady Akad. Nauk S. S. S. R. 108, 646 (1956) is reported in FIG. 1056 in "Phase Diagrams for Ceramist", edited by Levin, Robben and McMurdle, Am. Ceramic Soc., 1964. This diagram indicates a eutectic melt temperature of 235° C. at a composition of about 70 mol % $RbNO_3$, and about 30 mol % $Ba(NO_3)_2$. A mixture of this composition was formed by grinding 11.366 g of $RbNO_3$ with 8.633 g of $Ba(NO_3)_2$. The mixture was placed in a Pyrex ™ beaker and heated at 350° C. in air for about 16 hours. The salt mixture had not completely melted, so the temperature was increased to 415° C. and held there for 2 hours. The amount of solid at the end of this two hour period was reduced, but not eliminated. The liquid fraction was poured off into a Pyrex ™ beaker and placed in a vertical tube furnace and maintained in air at 360° C. for 2 hours.

The $KTiOPO_4$ single crystal substrate with the aluminum mask was placed in a platinum mesh basket. The basket containing the substrate was lowered into the molten salt. The basket was provided with a platinum mesh screen cover to keep the prevent the substrate from floating on the surface of the molten salt. The substrate was held in the molten salt for 45 minutes and the basket was then withdrawn from the molten salt.

carried out with clear and complete melts.

The aluminum mask was removed by using a 0.2M KOH aqueous solution at ambient temperature.

The substrate containing the channel waveguide was examined using a Zeiss Axiomat ™ phase contrast microscope to optically determine the thickness of the waveguide. The substrate containing the channel waveguide was then examined by the m-line prism-layer coupler technique and more than 10 TE modes and more than 10 TM modes were observed. The results are summarized in Table 2.

EXAMPLE 10

A channel waveguide was prepared on a $KTiOPO_4$ single crystal about 8 mm × 8 mm × 1 mm thick using the following procedure. An aluminum mask was formed on one of the polished z-surfaces using the procedure described in Example 9.

The composition of the molten salt was chosen so that it would be definitely in the liquid phase, and thereby avoid intrusion into the liquid/solid interface region of the phase diagram, at a contact temperature of 300° C. 80 mol % $RbNO_3$ (20.789 g) and 20 mol % $Ba(NO_3)_2$ (9.210 g) were combined in a Pyrex ™ beaker and heated at 300° C. in air for about 90 hours. The salt mixture was completely melted and the melt was clear.

The $KTiOPO_4$ single crystal substrate with the aluminum mask was placed in a platinum mesh basket, contacted with the molten salt and washed afterwards essentially using the procedure described in Example 9 except that the contact time was 2 hours.

The aluminum mask was removed by the procedure described in Example 9.

The substrate containing the channel waveguide was examined to optically determine the thickness of the waveguide and was then examined by the m-line prism-layer coupler technique. The results are summarized in Table 2.

EXAMPLE 11

A channel waveguide was prepared on a $KTiOPO_4$ single crystal about 6 mm×4 mm×0.8 mm thick using the following procedure. An aluminum mask was formed on one of the polished z-surfaces using the procedure described in Example 9.

The composition of the molten salt was chosen to demonstrate that even small amounts of divalent ions, in this Example $Ba^{++}$, are beneficial in decreasing the contact time and/or temperature necessary to form comparable waveguides using just $RbNO_3$ as the molten salt. 95 mol % $RbNO_3$ (27.435 g) and 5 mol % $Ba(NO_3)_2$ (2.559 g) were combined in a Pyrex ™ beaker and heated at 300° C. in air for about 2 hours. The salt mixture was completely melted and the melt was clear.

The $KTiOPO_4$ single crystal substrate with the metal mask was placed in a platinum mesh basket, contacted with the molten salt and washed afterwards essentially as described in Example 9 except that the contact time was 2 hours.

The aluminum mask was removed by the procedure described in Example 9.

The substrate containing the channel waveguide was examined to optically determine the thickness of the waveguide and was then examined by the m-line prism-layer coupler technique. The results are summarized in Table 2.

EXAMPLE 12

A channel waveguide was prepared on a $KTiOPO_4$ single crystal about 15 mm×6 mm×0.8 mm thick using the following procedure. An aluminum mask was formed on one of the polished z-surfaces using the procedure described in Example 9.

The composition of the molten salt was chosen to demonstrate that even small amounts of divalent ions, in this Example $Ba^{++}$, are beneficial in decreasing the contact time and/or temperature necessary to form comparable waveguides using just $RbNO_3$ as the molten salt. 98 mol % $RbNO_3$ (28.952 g) and 2 mol % $Ba(NO_3)_2$ (1.047 g) were combined in a Pyrex ™ beaker and heated at 360° C. in air for about 2 hours. The salt mixture was completely melted and the melt was clear.

The $KTiOPO_4$ single crystal substrate with the metal mask was placed in a platinum mesh basket, contacted with the molten salt and washed afterwards essentially as described in Example 9.

The aluminum mask was removed by the procedure described in Example 9.

The substrate containing the channel waveguide was examined to optically determine the thickness of the waveguide and was then examined by the m-line prism-layer coupler technique. The results are summarized in Table 2.

EXAMPLE 13

A channel waveguide was prepared on a $KTiOPO_4$ single crystal about 4 mm×4 mm×0.7 mm thick using the following procedure. An aluminum mask was formed on one of the polished z-surfaces using the procedure described in Example 9.

The composition of the molten salt was chosen to be 95 mol % $RbNO_3$ and 5 mol % $Ba(NO_3)_2$ and was prepared in the following manner. 5.48 g $RbNO_3$ and 0.5 g $Ba(NO_3)_2$ were combined in 10 mL of warm water. After complete solution was obtained the volume of the solution was reduced to 10 mL by heating. On cooling to room temperature, the salts started to precipitate out of solution. A thin coating of this salt mix slurry was rapidly applied to the masked $KTiOPO_4$ single crystal substrate. The substrate was then fired in air in a 3 zone BTU belt furnace with the temperature of all 3 zones at 300° C. The total length of the 3 hot zones is 24 inches and the belt speed was 0.64 cm per minute (¼ inch per minute) so that the contact time was 96 minutes. The salt mixture remained on the substrate during the entire firing cycle.

After cooling, the substrate was washed with water to remove the remaining salt mixture and the aluminum mask was removed by the procedure described in Example 9.

The substrate containing the channel waveguide was examined to optically determine the thickness of the waveguide and was then examined by the m-line prism-layer coupler technique. The results are summarized in Table 2.

EXAMPLE 14

A channel waveguide was prepared on a $KTiOPO_4$ single crystal about 3 mm×3 mm×0.7 mm thick using the following procedure. An aluminum mask was formed on one of the polished z-surfaces using the procedure described in Example 9.

The phase diagram for $RbNO_3$—$Ca(NO_3)_2$ prepared by P. I. Protsenko et al., Zhur. Neorg. Khim. 2, 2618 (1957) is reported in FIG. 1057 in "Phase Diagrams for Ceramist", edited by Levin, Robben and McMurdle, Am. Ceramic Soc., 1964. This diagram indicates that a composition of 80 mol % $RbNO_3$ and 20 mol % $Ba(NO_3)_2$ would remain liquid in the desired operating temperature range of 300° C. to 350° C. A molten solution of this composition was formed by combining 21.42 g of $RbNO_3$ with 8.57 g of $Ca(NO_3)_2.H_2O$ in a 30 mL Pyrex ™ beaker, placing the beaker in a vertical furnace and heating it in air at 300° C. For approximately 30 minutes, bubbles were seen coming through the melt. After the bubbling stopped, the melt was allowed to remain at 300° C. for about 2 hours.

The $KTiOPO_4$ single crystal substrate with the aluminum mask was placed in a platinum mesh basket, contacted with the molten salt and washed afterwards essentially as described in Example 9 except that the contact time was 2 hours.

The aluminum mask was removed by the procedure described in Example 9.

The substrate containing the channel waveguide was examined to optically determine the thickness of the waveguide and was then examined by the m-line prism-layer coupler technique. The results are summarized in Table 2.

EXAMPLE 15

A channel waveguide was prepared on a $KTiOPO_4$ single crystal about 3 mm×3 mm×0.7 mm thick using the following procedure. An aluminum mask was formed on one of the polished z-surfaces using the procedure described in Example 9.

A molten salt solution of composition 80 mol % $RbNO_3$—20 mol % $Ba(NO_3)_2$ was prepared using the procedure and quantities of salts used in Example 14 except that the molten salt was heated to 330° C. and allowed to remain at 330° C. for 2 hours.

The KTiOPO4 single crystal substrate with the aluminum mask was placed in a platinum mesh basket, contacted with the molten salt and washed afterwards essentially as described in Example 9 except that the contact time was 2 hours.

The aluminum mask was removed by the procedure described in Example 9.

The substrate containing the channel waveguide was examined to optically determine the thickness of the waveguide and was then examined by the m-line prism-layer coupler technique. The results are summarized in Table 2.

EXAMPLE 16

Channel waveguides were prepared on two KTiOPO4 single crystals each about 13 mm×7 mm×0.7 mm thick using the following procedure. Aluminum masks were formed on one of the polished z-surfaces of each of the two KTiOPO4 single crystals using the procedure described in Example 9.

A molten salt solution of composition 80 mol % $RbNO_3$—20 mol % $Ba(NO_3)_2$ was prepared using the procedure used in Example 14 except that the quantities of salts used were double those used in Example 14, i. e., 42.84 g of $RbNO_3$ and 17.14 g of $Ca(NO_3)_2.H_2O$. After these salts were mixed, the mixture was divided into two equal portions in order to carry out two parallel experiments in different vertical furnaces. Each portion was placed in a 30 mL Pyrex TM beaker. In each experiment, the beaker was placed in a vertical furnace and heated to 310° C. and allowed to remain at 310° C. for about 2 hours.

In each experiment, the KTiOPO4 single crystal substrate with the aluminum mask was placed in a platinum mesh basket, contacted with the molten salt and washed afterwards essentially as described in Example 9 except that the contact time was 2 hours and 15 minutes.

The aluminum masks were removed by the procedure described in Example 9.

The substrates containing the channel waveguide were examined to optically determine the thickness of the waveguide and were then examined by the m-line prism-layer coupler technique. The results obtained for the two waveguides agree within experimental error. The results for one of the waveguides are summarized in Table 2.

EXAMPLE 17

A channel waveguide was prepared on a KTiOPO4 single crystal about 2 mm×4 mm×0.7 mm thick using the following procedure. An aluminum mask was formed on one of the polished z-surfaces using the procedure described in Example 9.

The phase diagram for $RbNO_3$—$Sr(NO_3)_2$ prepared by V. E. Plyushchev et al., Zhur. Neorg. Khim. 1, 1614 (1956) is reported in FIG. 1058 in "Phase Diagrams for Ceramist", edited by Levin, Robben and McMurdle, Am. Ceramic Soc., 1964. This diagram indicates that a composition of 80 mol % $RbNO_3$ and 20 mol % $Ba(NO_3)_2$ would remain liquid in the desired operating temperature of 300° C. A molten solution of this composition was formed by combining 22.074 g of $RbNO_3$ and 7.92 g of $Sr(NO_3)_2$ in a 30 mL Pyrex TM beaker, placing the beaker in a vertical furnace and heating it in air at 300° C. and allowed to remain at 300° C. for about 2 hours.

The KTiOPO4 single crystal substrate with the aluminum mask was placed in a platinum mesh basket, contacted with the molten salt and washed afterwards essentially as described in Example 9 except that the contact time was 2 hours.

The aluminum mask was removed by the procedure described in Example 9.

The substrate containing the channel waveguide was examined to optically determine the thickness of the waveguide and was then examined by the m-line prism-layer coupler technique. The results are summarized in Table 2.

EXAMPLE 18

A channel waveguide was prepared on a KTiOPO4 single crystal about 5 mm×4 mm×0.7 mm thick using the following procedure. An titanium mask was formed on one of the polished z-surfaces by pulling a graphite fiber taunt over a z-surface of the crystal substrate and holding it with tape at each end. Titanium is then evaporated onto the surface to form a 700 Å (70 nm) thick film. The graphite fiber is then removed to expose the crystal surface beneath it. The exposed surface is about 6 μm wide and runs the length of the crystal.

The phase diagram for RbCl-ZnCl prepared by B. F. Markov et al., Ukrain. Khim. Zhur. 22, 290 (1956) is reported in FIG. 1335 in "phase Diagrams for Ceramist", edited by Levin, Robben and McMurdle, Am. Ceramic Soc., 1964. This diagram indicates a eutectic composition of about 49 mol % RbCl and 51 mol % $ZnCL_2$ with a melting temperature of 249° C. A molten solution of this composition was formed by combining 14.402 g of RbCl with 15.59 g of $ZnCl_2$ in a 50 mL Pyrex TM beaker, placing the beaker in a vertical furnace and heating it in air at 400° C. for about 72 hours. The temperature was then lowered to 300° C. When some solidification in the melt was observed, the temperature was increased to 325° C. and the solids completely dissolved.

The KTiOPO4 single crystal substrate with the titanium mask was placed in a platinum mesh basket and contacted with the 325° C. molten salt and held there for 20 minutes. The basket was then withdrawn from the molten salt and allowed to cool to room temperature before it was immersed in water at room temperature to wash off the residual chlorides.

The titanium mask was removed using a solution comprised of 4 vol % HF, 4 vol % $H_2O_2$ and 92 vol % $H_2O$ at room temperature.

The substrate containing the channel waveguide was examined to optically determine the thickness of the waveguide and was then examined by the m-line prism-layer coupler technique. The results are summarized in Table 2.

TABLE 2

| Ex. | Molten Mat'l (mol %) | | Contact Temp. (°C.) | Time (hours) | Type Modes Obsd. | No. modes Obsd. | d* (μm) | Δn |
| --- | --- | --- | --- | --- | --- | --- | --- | --- |
| 9 | $RbNO_3$ | 77.3 | 360 | 0.75 | TE | 10+ | −100 | 0.0287 |
|   | $Ba(NO_3)_2$ | 22.6 |     |      | TM | 10+ |      | 0.0354 |
| 10 | $RbNO_3$ | 80 | 300 | 2 | TE | 8 | 15 | 0.0295 |
|    | $Ba(NO_3)_2$ | 20 |     |   | TM | 9 |    | 0.0237 |

TABLE 2-continued

| Ex. | Molten Mat'l (mol %) | | Contact Temp. (°C.) | Time (hours) | Type Modes Obsd. | No. modes Obsd. | d* (μm) | Δn |
|---|---|---|---|---|---|---|---|---|
| 11 | RbNO$_3$ | 95 | 300 | 2 | TE | 4 | −4 | 0.0152 |
|    | Ba(NO$_3$)$_2$ | 5 | | | TM | 4 | | 0.0144 |
| 12 | RbNO$_3$ | 98 | 360 | 0.75 | TE | 6 | 4 | 0.0173 |
|    | Ba(NO$_3$)$_2$ | 2 | | | TM | 6 | | 0.0180 |
| 13 | RbNO$_3$ | 95 | 300 | 1.6 | TE | 3 | −5 | 0.0112 |
|    | Ba(NO$_3$)$_2$ | 5 | | | TM | 3 | | 0.0102 |
| 14 | RbNO$_3$ | 80 | 300 | 2 | TE | 2 | 1.5 | 0.0079 |
|    | Ca(NO$_3$)$_2$ | 20 | | | TM | 2 | | 0.0067 |
| 15 | RbNO$_3$ | 80 | 330 | 2 | TE | 3 | −2 | 0.0159 |
|    | Ca(NO$_3$)$_2$ | 20 | | | TM | 3 | | 0.0138 |
| 16 | RbNO$_3$ | 80 | 310 | 2.25 | TE | 2 | −1.5 | 0.0116 |
|    | Ca(NO$_3$)$_2$ | 20 | | | TM | 2 | | 0.0099 |
| 17 | RbNO$_3$ | 80 | 300 | 2 | TE | 5 | 7 | 0.0174 |
|    | Sr(NO$_3$)$_2$ | 20 | | | TM | 5 | | 0.0184 |
| 18 | RbCl | 49 | 325 | 0.33 | TE | 4 | −8 | 0.0143 |
|    | ZnCl$_2$ | 51 | | | TM | 3 | | 0.0127 |

*determined optically

We claim:

1. A process for producing an optical waveguide comprising contacting at least one optically smooth surface of a single crystal of $K_{1-x}Rb_xTiOMO_4$ wherein x is from 0 to 1 and M is P or As with a molten salt or molten mixture of salts of at least one salt of Rb, Cs and Tl at a temperature of from about 200° C. to about 600° C. for a time sufficient to increase the surface index of refraction at least about 0.00025 with respect to the index of refraction of the starting crystal, and cooling the resulting crystal, with the provisos that (a) when x is from 0 to 0.8, said molten salt is at least one selected from the group consisting of RbNO$_3$, CsNO$_3$, TlNO$_3$, and said molten mixture is at least one of RbNO$_3$, CsNO$_3$, TlNO$_3$ with at least one nitrate selected from the group of Ca(NO$_3$)$_2$, Sr(NO$_3$)$_2$ and Ba(NO$_3$)$_2$ or of RbCl with at least one chloride selected from the group of ZnCl$_2$ and LiCl; and (b) when x is at least 0.8, said molten salt is at least one selected from the group consisting of CsNO$_3$ and TlNO$_3$ and said molten mixture is at least one of CsNO$_3$ and TlNO$_3$ with at least one nitrate selected from the group of Ca(NO$_3$)$_2$, Sr(NO$_3$)$_2$ and Ba(NO$_3$)$_2$.

2. A process as in claim 1 wherein said molten mixture is of RbCl containing dissolved therewith at least one chloride selected from the group consisting of ZnCl$_2$ and LiCl.

3. A process as in claim 1 wherein x is zero.

4. A process as in claim 3 wherein M is phosphorous.

5. A process as in claim 4 wherein said molten mixture used is at least one of RbNO$_3$, CsNO$_3$ and TlNO$_3$ with at least one nitrate selected from the group of Ca(NO$_3$)$_2$, Sr(NO$_3$)$_2$ and Ba(NO$_3$)$_2$.

6. A process as in claim 5 wherein said optically smooth surface is a z-surface.

7. A process as in claim 6 wherein said time of contact is from about 0.25 hour to about 6 hours.

8. A process as in claim 7 wherein said temperature is from about 300° C. to about 450° C.

9. A process as in claim 8 wherein said surface having an increased index of refraction is at least about 0.25 μm deep.

10. A process as in claim 9 wherein said increase in surface index of refraction is at least about 0.001.

11. A process as in claim 8 wherein said cooled crystal is washed with water to remove any excess salt.

12. A process as in claim 1 wherein a mask is applied to the surface of said single crystal so that contacting results in the formation of a channel having said increase in index of refraction.

13. A process as in claim 12 wherein said cooled crystal is washed with water to remove any excess salt.

14. A process as in claim 13 wherein said mask is removed from the surface of said crystal after cooling.

* * * * *